United States Patent
Ban et al.

(10) Patent No.: US 8,557,406 B2
(45) Date of Patent: Oct. 15, 2013

(54) COATED PCBN CUTTING INSERT, COATED PCBN CUTTING TOOL USING SUCH COATED PCBN CUTTING INSERT, AND METHOD FOR MAKING THE SAME

(75) Inventors: Zhigang Ban, Latrobe, PA (US); Yixiong Liu, Latrobe, PA (US)

(73) Assignee: Kennametal Inc., Latrobe, PA (US)

( * ) Notice: Subject to any disclaimer, the term of this patent is extended or adjusted under 35 U.S.C. 154(b) by 441 days.

(21) Appl. No.: 12/722,042

(22) Filed: Mar. 11, 2010

(65) Prior Publication Data
US 2010/0255345 A1 Oct. 7, 2010

Related U.S. Application Data

(63) Continuation-in-part of application No. 12/057,564, filed on Mar. 28, 2008, now Pat. No. 8,080,323, which is a continuation-in-part of application No. 11/823,679, filed on Jun. 28, 2007, now abandoned.

(51) Int. Cl.
  *B32B 9/00* (2006.01)
(52) U.S. Cl.
  USPC ............... 428/701; 51/307; 51/309; 428/697; 428/698; 428/699; 428/702
(58) Field of Classification Search
  USPC ............ 51/307, 309; 428/697, 698, 699, 701, 428/702, 704
  See application file for complete search history.

(56) References Cited

U.S. PATENT DOCUMENTS

| | | | |
|---|---|---|---|
| 4,880,755 A | 11/1989 | Mehrotra | |
| 5,372,873 A | 12/1994 | Yoshimura et al. | |
| 5,374,471 A | 12/1994 | Yoshimura et al. | |
| 5,487,625 A | 1/1996 | Ljungberg et al. | |

(Continued)

FOREIGN PATENT DOCUMENTS

| | | | |
|---|---|---|---|
| EP | 1 717 348 A2 | | 2/2006 |
| JP | 06-055311 | * | 1/1994 |

OTHER PUBLICATIONS

Moltrecht, "Machine Shop Practice, Secon Edition", vol. 1, Industrial Press Inc, New York, NY (1981) pp. 199-204.

(Continued)

*Primary Examiner* — Archene Turner
(74) *Attorney, Agent, or Firm* — Matthew W. Gordon, Esq.

(57) ABSTRACT

A coated polycrystalline cubic boron nitride cutting insert useful in a cutting tool for removing material from a workpiece, and a method for making the same. The cutting insert including a polycrystalline cubic boron nitride substrate with a rake surface and at least one flank surface, and a cutting edge formed at the juncture between the rake surface and the flank surface. A wear-resistant coating scheme is on the polycrystalline cubic boron nitride substrate. The wear-resistant coating scheme includes the following coating layers. An inner coating layer region is on at least some of the rake surface and at least some of the flank surface of the polycrystalline cubic boron nitride substrate. An alumina-containing coating layer region, which has at least one exposed alumina coating layer, is on the inner coating layer region. The exposed alumina coating layer exhibiting a post-blasted stress condition with stress ranging between about 50 MPa (tensile stress) and about −2 GPa (compressive stress) as measured by XRD using the Psi tilt method and the (024) reflection of alumina. The exposed coating layer is the result of wet blasting an outer titanium-containing coating layer from the surface of the alumina-containing coating layer region.

17 Claims, 7 Drawing Sheets

(56) References Cited

U.S. PATENT DOCUMENTS

| | | | |
|---|---|---|---|
| 5,503,913 | A | 4/1996 | Konig et al. |
| 5,525,134 | A | 6/1996 | Mehrotra et al. |
| 5,635,247 | A | 6/1997 | Ruppi |
| 5,861,210 | A | 1/1999 | Lenander et al. |
| 5,863,640 | A | 1/1999 | Ljungberg et al. |
| 6,090,476 | A | 7/2000 | Thysell et al. |
| 6,383,624 | B1 | 5/2002 | Soderberg et al. |
| 6,737,178 | B2 | 5/2004 | Ota et al. |
| 6,884,496 | B2 | 4/2005 | Westphal et al. |
| 7,232,603 | B2 * | 6/2007 | Hessman ............. 428/702 |
| 7,393,263 | B2 | 7/2008 | Okada et al. |
| 7,455,918 | B2 | 11/2008 | Gates, Jr. et al. |
| 7,476,063 | B2 | 1/2009 | Wickman et al. |
| 7,476,437 | B2 * | 1/2009 | Jonsson ............. 428/701 |
| 7,531,213 | B2 | 5/2009 | Bjormander |
| 7,691,496 | B2 * | 4/2010 | Park et al. ............. 428/698 |
| 7,785,665 | B2 | 8/2010 | Gates, Jr. et al. |
| 8,012,611 | B2 | 9/2011 | Okada et al. |
| 2003/0104254 | A1 | 6/2003 | Westphal et al. |
| 2005/0123366 | A1 | 6/2005 | Goudemond et al. |
| 2006/0127671 | A1 | 6/2006 | Park et al. |
| 2006/0204757 | A1 | 9/2006 | Ljungberg |
| 2006/0257690 | A1 | 11/2006 | Bjormander |
| 2007/0009763 | A1 | 1/2007 | Littecke et al. |
| 2007/0298281 | A1 | 12/2007 | Andersson et al. |
| 2007/0298282 | A1 | 12/2007 | Andersson et al. |
| 2008/0107882 | A1 | 5/2008 | Littecke et al. |
| 2011/0123829 | A1 | 5/2011 | Sjolen et al. |

OTHER PUBLICATIONS

Merchant, "Principles of Metal Cutting and Machinability", Section 17, Tool Engineer's Handbook, (1949) pp. 302-315.

American National Standard, ANSI B212.4-2002 for Cutting Tools—Indexable Inserts—Identification System, Sponsor Cemented Carbide Producers Association (2002).

PCT Application No. PCT/US2011/025179, Notification of Transmittal of International Search Report and the Written Opinion of the International Searching Authority, mailed Oct. 25, 2011 (2 pages).

PCT Application No. PCT/US2011/025179, International Search Report mailed Oct. 25, 2011, (3 pages).

PCT Application No. PCT/US2011/025179, Written Opinion mailed Oct. 25, 2011, (5 pages).

* cited by examiner

ψ = TILT ANGLE

φ = ROTATION ANGLE $\sigma_1$ $\sigma_2$ = PRINCIPAL STRESSES $\sigma_\varphi$ = STRESS AT ROTATION ANGLE φ

COATED PCBN CUTTING INSERT, COATED PCBN CUTTING TOOL USING SUCH COATED PCBN CUTTING INSERT, AND METHOD FOR MAKING THE SAME

CROSS-REFERENCE TO EARLIER CO-PENDING PATENT APPLICATION

This patent application is a continuation-in-part of earlier filed U.S. patent application Ser. No. 12/057,564 filed Mar. 28, 2008 now U.S. Pat. No. 8,080,323 by Zhigang Ban, Mark J. Rowe, Yixiong Liu, Alfred S. Gates, Jr., Kent P. Mizgalski and Mark S. Greenfield for a CUTTING INSERT WITH A WEAR-RESISTANT COATING SCHEME EXHIBITING WEAR INDICATION AND METHOD OF MAKING THE SAME, which is a continuation-in-part of earlier-filed U.S. patent application Ser. No. 11/823,679 filed on Jun. 28, 2007 now abandoned by Zhigang Ban, Mark J. Rowe, Yixiong Liu, and Alfred S. Gates, Jr. for a CUTTING INSERT WITH A WEAR-RESISTANT COATING SCHEME EXHIBITING WEAR INDICATION AND METHOD OF MAKING THE SAME. Applicants herein (Zhigang Ban, and Yixiong Liu) claim under the United States Patent Statute (Title 35, United States Code) including 35 U.S.C. §120 the benefit of the filing date of each one of such earlier patent applications; namely, U.S. patent application Ser. No. 11/823,679 and U.S. patent application Ser. No. 12/057,564).

Further, applicants hereby incorporate by reference herein the entirety of each one of the above-mentioned United States patent applications, i.e., U.S. patent application Ser. No. 11/823,679 [filed Jun. 28, 2007] and U.S. patent application Ser. No. 12/057,564 [filed Mar. 28, 2008].

BACKGROUND OF THE INVENTION

The present invention pertains to a polycrystalline cubic boron nitride (PcBN) cutting insert, and especially a coated PcBN cutting insert. The coated PcBN cutting insert attaches to a support with the support and PcBN cutting insert comprising a coated PcBN cutting tool. The coated PcBN cutting tool is useful for the removal of material from a workpiece, e.g., chipforming machining of a workpiece.

Heretofore, artisans have used PcBN cutting tools for the removal of material from a workpiece, e.g., chipforming machining of a workpiece. Patent documents, such as for example, U.S. Pat. No. 7,455,918 B2 to Gates, Jr., et al. (assigned to Kennametal Inc.), provide some examples of these PcBN cutting inserts. In this regard, U.S. Pat. No. 7,455,918 B2 describes via Inventive Heat Nos. 3 and 4 (see Columns 13-13), as well as Col. 19, line 63 through Col. 21, line 37, coating processes for a substrate that includes PcBN. Further, U.S. Pat. No. 5,503,913 to König et al. describes a PcBN cutting tool. U.S. Pat. No. 7,476,063 to Wickman et al. describes a PcBN cutting tool wherein a PcBN layer forms the face of a cutting tool. U.S. Patent Application Publication No. US2005/0123366A1 to Goudemond et al. describes a PcBN cutting tool that appears to have a body with pockets wherein each pocket receives a compact such as a PcBN compact. U.S. Pat. No. 6,737,178 to Ota et al. describes a PcBN cutting tool wherein a base contains pockets that appear to carry a PcBN substrate. There is a coating on the PcBN substrate. U.S. Pat. No. 6,090,476 to Thysell et al. appears to show a PcBN cutting tool.

A coating scheme (i.e., coating layer(s)) applied via CVD to a cobalt cemented tungsten carbide substrate exhibits a tensile stress. The presence of the tensile stress is detrimental to the adhesion of the CVD coating scheme. Heretofore, some have used a post-coating blasting treatment to reduce the tensile stresses in the coating scheme or to change the stress to compressive stress in the coating scheme.

As one example, U.S. Pat. No. 5,372,873 to Yoshimura et al. (assigned to Mitsubishi Materials Corporation) discloses shot peening the coating scheme on selected surfaces wherein the substrate is a cobalt cemented tungsten carbide, which exhibits a surface layer of cobalt enrichment. The result of shot peening is a change in the stress condition of the coating. In this regard, this patent shows that the shot peening process may be applied locally to parts of the cutting tool, for example to the rake surfaces, so that the residual tensile stresses in the primary coating thereon are lower than those tensile residual stresses in the primary coating on the flank surfaces of the cutting tool. Further, this patent also shows a shot peening treatment applied so that the residual stresses in the primary coating of the rake surfaces of the cutting tool are compressive, and that the residual stresses in the primary coating of the flank surfaces are tensile.

As another example, U.S. Pat. No. 5,374,471 to Yoshimura et al. (assigned to Mitsubishi Materials Corporation) discloses shot peening a coating layer on a substrate wherein the shot peening is effective to treat only the rake surfaces. The substrate is a cobalt cemented tungsten carbide, which exhibits a surface layer of cobalt enrichment.

A coating scheme (i.e., coating layer(s)) applied via CVD to a cermet substrate exhibits a tensile stress. United States Patent Application Publication No. US2006/0127671 A1 to Park et al. discloses the use of wet blasting as a post-coating treatment of a coating on a cemented carbide substrate, as well as cermet substrate. The wet blasting process uses alumina particles, which have a size between 10-300 µm, water slurry. There is a reduction in the tensile stress or a conversion to compressive stress in the outer coating layer due to the wet blasting. Specific coating schemes include an alumina coating with titanium carbide/titanium nitride layer(s) on top of the alumina layer.

Another consequence of a post-coating treatment such as wet blasting is a smoothening of the coating surface. United States Patent Application Publication No. US2006/0204757 A1 to Ljungberg discloses a two-step wet blasting post-coating treatment for a coating scheme comprising a $TiC_xN_y$ coating layer and an $\alpha$-$Al_2O_3$ coating layer. The substrate is a cobalt cemented tungsten carbide material. These treatments show the affect due to variations in impingement angle and pressure. This treatment results in a smoother coating surface and a reduction in tensile stress or a conversion to compressive stress. U.S. Pat. No. 5,861,210 to Lenander et al., which discloses a Ti $C_xN_yO_z$ layer on alumina (see Col. 2, lines 30-43), discloses that it is known to vary the blasting parameters (see Example 1, Col. 4, line 48 through Col. 5, line 11) to achieve different results.

United States Patent Application Publication No. US2007/0009763 A1 to Littecke et al. discloses a wet blasting post-coating treatment for a coating scheme comprising a $TiC_xN_y$ coating layer and an $\alpha$-$Al_2O_3$ coating layer. The substrate is a cobalt cemented tungsten carbide material. This treatment results in a smoother coating surface and a low tensile stress $TiC_xN_y$ coating layer and a smooth $\alpha$-$Al_2O_3$ coating layer.

Each one of United States Patent Application Publication No. US2007/0298281 A1 to Andersson et al. and United States Patent Application Publication No. US2007/0298282 A1 to Andersson et al. discloses a wet blasting post-coating treatment for a coating scheme comprising a $TiC_xN_y$ coating layer and an $\alpha$-$Al_2O_3$ coating layer. The substrate is a cobalt cemented tungsten carbide material. This treatment results in a low tensile stress $TiC_xN_y$ coating layer and a smooth α-Al$_2$O$_3$ coating layer. The stress condition is different between the rake surface and the flank surface.

In addition to wet blasting, some have used dry blasting to reduce the tensile stress in the coating. For example, U.S. Pat. No. 6,884,496 to Westphal et al. discloses the basic benefits of dry blasting a coated cutting insert wherein there is an increase in the compressive stress. See Col. 2, lines 42-67.

There should be an appreciation that some of the blasting operations remove only a small portion of the coating layer. U.S. Pat. No. 7,531,213 to Bjormander pertains to a coated cutting tool insert wherein the post-treatment (preferably blasting or brushing) removes the outermost coating layer only on the edge-line and on the rake face.

Some of the above patent documents show a cutting insert useful for the removal of material from a workpiece, e.g., chipforming machining of a workpiece, wherein the coating scheme has been subjected to a post-coating treatment. This post-coating treatment has resulted in a reduction of the tensile stress or a conversion of the stress to compressive stress in the coating layer(s). This post-coating treatment has resulted in a smoothening of the outer coating layer. However, many of these patent documents show a cutting insert, which possesses a cemented carbide substrate or in one case, a cermet substrate. These patent documents do not disclose the actual implementation of a post-coating treatment to a coating that has been applied to the surface of a PcBN body (or PcBN cutting insert) resulting in a reduction of the tensile stress or a conversion of the stress to compressive stress in the coating layer(s), as well as a smoothening of the outer coating layer.

SUMMARY OF THE INVENTION

In one form thereof, the invention is a coated polycrystalline cubic boron nitride cutting insert that comprises a polycrystalline cubic boron nitride substrate, which has a rake surface and at least one flank surface, and a cutting edge formed at the juncture between the rake surface and the flank surface. There is a wear-resistant coating scheme which comprises the following coating layers. There is an inner coating layer region deposited by chemical vapor deposition on at least some of the rake surface and at least some of the flank surface of the polycrystalline cubic boron nitride substrate. There is an alumina-containing coating layer region deposited by chemical vapor deposition on the inner coating layer region, and the alumina-containing coating layer region comprising at least one exposed alumina coating layer. The exposed alumina coating layer exhibits a post-blasted stress condition ranging between about 50 MPa (tensile stress) and about −2 Gpa (compressive stress) as measured by XRD using the Psi tilt method and the (024) reflection of alumina.

In another form thereof, the invention is a coated polycrystalline cubic boron nitride cutting tool for removing material from a workpiece. The coated polycrystalline cubic boron nitride cutting tool comprises a support and a polycrystalline cubic boron nitride cutting insert on the support. The polycrystalline cubic boron nitride cutting insert comprises a polycrystalline cubic boron nitride substrate which has a rake surface and at least one flank surface, and a cutting edge formed at the juncture between the rake surface and the flank surface. There is a wear-resistant coating scheme that comprises the following coating layers. There is an inner coating layer region deposited by chemical vapor deposition on at least some of the rake surface and at least some of the flank surface of the polycrystalline cubic boron nitride substrate. There is an alumina-containing coating layer region deposited by chemical vapor deposition on the inner coating layer region. The alumina-containing coating layer region comprises at least one exposed alumina coating layer. The exposed alumina coating layer exhibits a post-blasted stress condition ranging between about 50 MPa (tensile stress) and about −2 GPa (compressive stress) as measured by XRD using the Psi tilt method and the (024) reflection of alumina.

In still another form, the invention is a method of making a coated polycrystalline cubic boron nitride cutting insert comprising the steps of: providing a polycrystalline cubic boron nitride substrate, the polycrystalline cubic boron nitride substrate having a rake surface and at least one flank surface, and a cutting edge formed at the juncture between the rake surface and the flank surface; depositing on at least some of the rake surface and at least some of the flank surface of the polycrystalline cubic boron nitride substrate by chemical vapor deposition an inner coating layer region; depositing on the inner coating region by chemical vapor deposition an alumina-containing coating layer region, and the alumina-containing coating layer region comprising at least one outermost alumina coating layer; depositing on the alumina-containing coating layer region by chemical vapor deposition an outer titanium-containing coating layer region; and wet blasting off the outer titanium-containing coating layer region thereby exposing the outermost alumina coating layer to form an exposed alumina coating layer and changing the stress condition of the exposed outermost alumina coating layer from an initial tensile stress condition ranging between about 50 MPa (tensile stress) and about 800 MPa (tensile stress) as measured by as measured by XRD using the Psi tilt method and the (024) reflection of alumina to a post-blasted stress condition ranging between about 50 MPa (tensile stress) and about −2 Gpa (compressive stress) as measured by XRD using the Psi tilt method and the (024) reflection of alumina.

BRIEF DESCRIPTION OF THE DRAWINGS

The following is a brief description of the drawings that form a part of this patent application.

DETAILED DESCRIPTION

Figure 1:
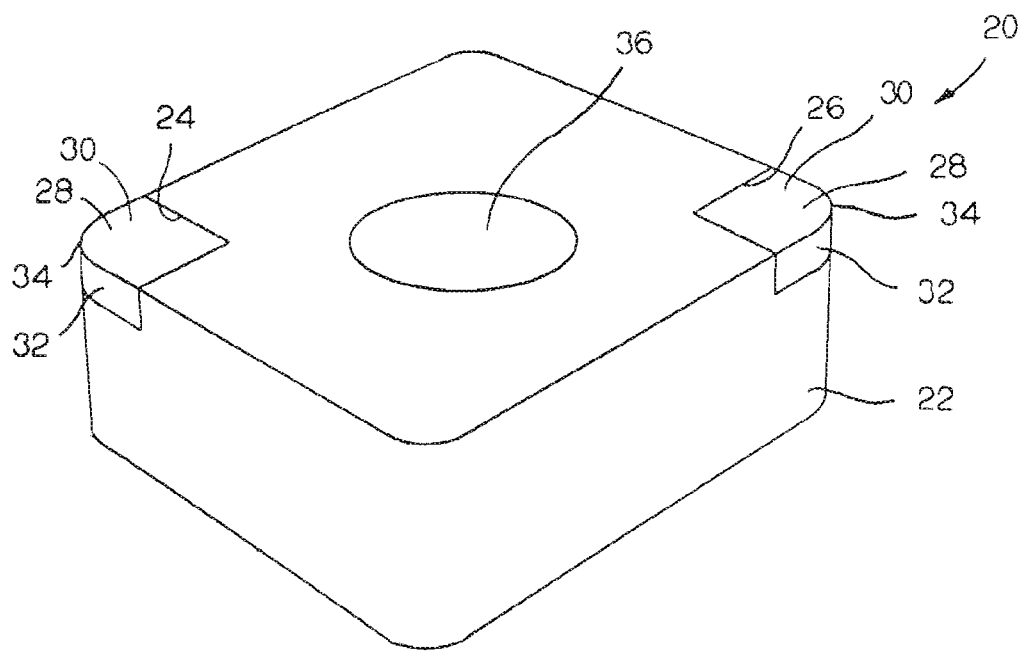
FIG. 1 is an isometric view of a specific embodiment of a coated PcBN cutting tool of the invention wherein the cutting tool comprises a support with oppositely disposed notches wherein each notch carries a coated PcBN cutting insert in a post-blasted condition.
Figure 2:
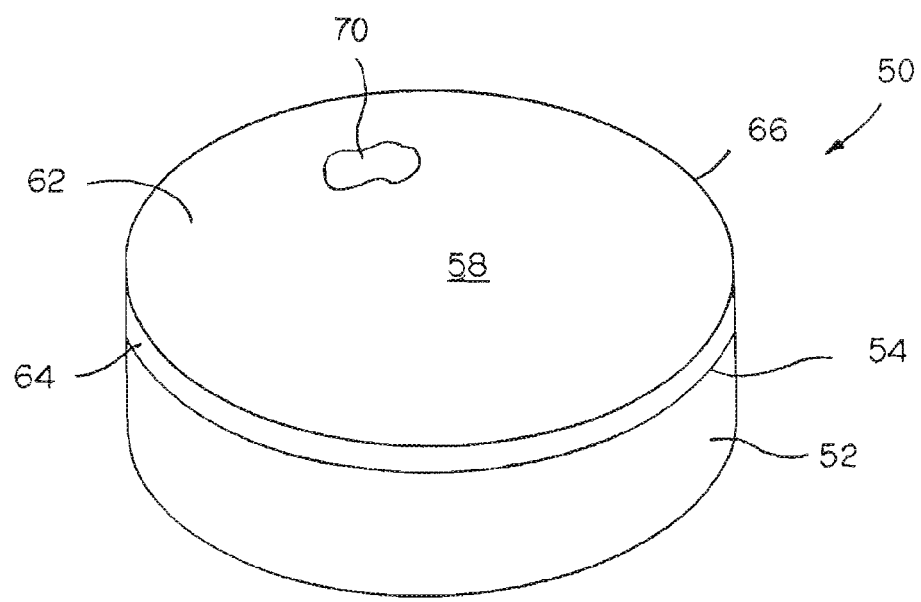
FIG. 2 is an isometric view of another specific embodiment of a coated PcBN cutting tool wherein the cutting tool comprises a support with a top surface to which is attached a coated PcBN cutting insert in a post-blasted condition.

Referring to the drawings, FIG. 1 shows a specific embodiment of a coated PcBN cutting tool, which is generally designated as 20, useful for the removal of material from a workpiece, e.g., chipforming machining of a workpiece. FIG. 2 shows another specific embodiment of a coated PcBN cutting tool, which is generally designated as 50, useful for the removal of material from a workpiece, e.g., chipforming machining of a workpiece.

In reference to the chipforming machining operation, material removal operations generate chips of the workpiece material. Publications that pertain to machining establish this fact. For example, the book *Machine Shop Practice* [Industrial Press Inc., New York, N.Y. (1981)] by Moltrecht, presents at pages 199-204 a description, inter alia, of chip formation, as well as different kinds of chips (i.e., continuous chip, discontinuous chip, segmental chip). Moltrecht reads [in part] at pages 199-200:

When the cutting tool first makes contact with the metal, it compresses the metal ahead of the cutting edge. As the tool advances, the metal ahead of the cutting edge is stressed to the point where it will shear internally, causing the grains of the metal to deform and to flow plastically along a plane called the shear plane . . . . When the type of metal being cut is ductile, such as steel, the chip will come off in a continuous ribbon . . . .

Moltrecht goes on to describe formation of a discontinuous chip and a segmented chip. As another example, the text found at pages 302-315 of the *ASTE Tool Engineers Handbook*, McGraw Hill Book Co., New York, N.Y. (1949) provides a lengthy description of chip formation in the metal cutting process. At page 303, the ASTE Handbook makes the clear connection between chip formation and machining operations such as turning, milling and drilling.

Referring to the coated PcBN cutting tool 20 of FIG. 1, the coated PcBN cutting tool 20 comprises a support 22, which has notches (24, 26) in the opposite corners. A typical material for the support is a tungsten carbide-cobalt material. The overall coated PcBN cutting tool 20 presents a geometry of SNGA432 per the ANSI Standard B-212.4-2002 entitled "American National Standards for Cutting Tools—Indexable Inserts—Identification System". There should be an appreciation that the scope of the invention is not limited to the specific embodiment of PcBN cutting insert 20 or the specific geometry of the PcBN cutting insert 20. The claims define the scope of the invention and applicants do not intend to restrict the scope of the invention by the specific embodiment. The coated PcBN cutting tool 20 further includes a coated PcBN cutting insert 28, which affixes (such as, for example by brazing) within each one of the notches (24, 26). The coated PcBN cutting insert 28 has a rake surface 30 and at least one flank surface 32. A cutting edge 34 is at the juncture between the rake surface 30 and the flank surface 32. The coated PcBN cutting tool 20 further contains a central aperture 36, which assists the connection of the coated PcBN cutting tool 20 to the cutting tool holder. The coated PcBN cutting insert 28 includes a substrate, which FIG. 1 does not illustrate because the coating scheme covers the PcBN substrate.

Referring to the coated PcBN cutting tool 50 of FIG. 2, the coated PcBN cutting tool 50 presents a geometry of RNG45 per the ANSI Standard B-212.4-2002 entitled "American National Standards for Cutting Tools—Indexable Inserts—Identification System". The coated PcBN cutting tool 50 has a support 52 with a top surface 54. A typical material for the support is a tungsten carbide-cobalt material. A PcBN cutting insert 58 attaches (e.g., via brazing or the like) to the top surface 54 of the support 52. The PcBN cutting insert 58 has a rake surface 62 and at least one flank surface 64 wherein a cutting edge 66 is at the juncture between the rake surface 62 and at least one flank surface 64. The coated PcBN cutting insert 58 includes a PcBN substrate 70, which FIG. 2 illustrates because a portion of the coating scheme has been removed for illustrative purposes to show the PcBN substrate 70.

Referring to the composition of the PcBN substrate of the coated PcBN cutting insert (28 in FIG. 1 and 58 in FIG. 2), the PcBN may comprise a PcBN component and a binder component such as, for example, cobalt or other components. In some cases, the PcBN content may be greater than about 80 weight percent with the balance binder material. In other cases, the PcBN content may be less than 60 weight percent with the balance binder material. Exemplary compositions of the PcBN substrate are set forth in Table 1 below.

TABLE 1

Specific Compositions for the PcBN Substrate

| Composition | PcBN (% by weight) | Binder material (% by weight) | Other components (% by weight) |
|---|---|---|---|
| A | 55 | 38 | 7 |
| B | 52 | 36 | 12 |
| C | 64 | 19 | 17 |
| D | 74 | 23 | 3 |
| E | 80 | 11 | 10 |

Specific ranges for the composition of the PcBN substrate are set forth below in Table 2.

TABLE 2

Specific Ranges for the Compositions for the PcBN Substrate

| Exemplary Range | PcBN (% by weight) | Binder material (% by weight) | Other components (% by weight) |
|---|---|---|---|
| 1 | 40-70 | 10-40 | 2-20 |
| 2 | 75-95 | 2-20 | 0.1-10 |

In reference to the determination of the composition of the PcBN cutting insert, the technique to determine the weight percent of the components is X-ray diffraction. The parameters for the X-ray diffraction technique are based upon Rietveld quantitative analysis. The Rietveld refinement method requires the x-ray diffraction data be in fixed optics format. If the powder diffraction data was collected using programmable optics, the data must first be converted to fixed optics data. The fixed optics data is corrected for any known sample displacement. A background profile is fitted and peak search is performed on the specimen data to identify all peak positions and peak intensities. The peak position and intensity data is used to identify the crystal phase composition of the powder specimen using any of the commercially available crystal phase databases.

Crystal structure data is inputted for each of the crystalline phases present in the specimen. Reitveld refinement is completed using the input structure data. Typical Rietveld refinement parameters settings are:

| | |
|---|---|
| Background calculation method | Polynomial |
| Sample Geometry | Flat Plate |
| Linear Absorption Coefficient | Calculated from average specimen composition |
| Weighting Scheme | Against Iobs |
| Profile Function | Pseudo-Voight |
| Profile Base Width | 8.0 |
| Least Squares Type | Newton-Raphson |
| Polarization Coefficient | 1.0 |

All Rietveld phase analysis results are reported in weight percent values.

Figure 3:
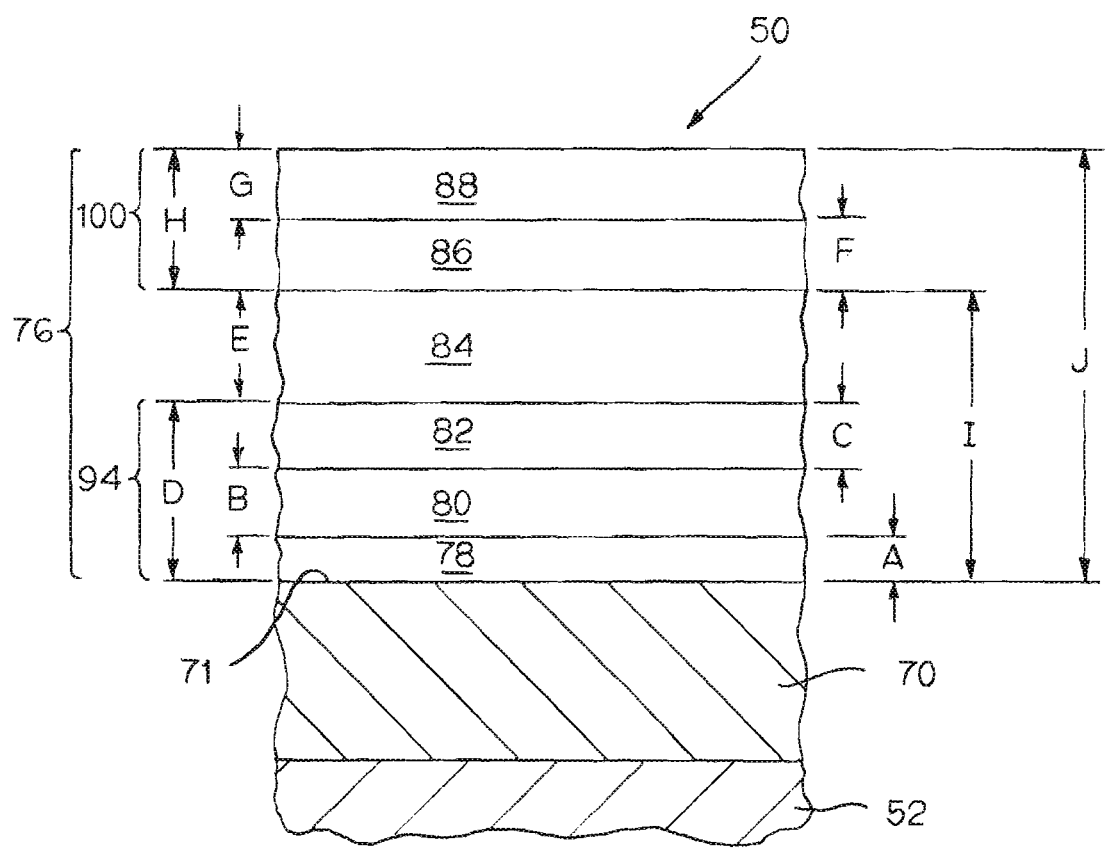
FIG. 3 is a cross-sectional view of the coated PcBN cutting tool of the invention of FIG. 2, but in an intermediate condition (or pre-blasted condition) wherein the PcBN substrate has deposited thereon via chemical vapor deposition the following coating scheme: a titanium nitride base coating layer applied by MT-CVD (moderate temperature chemical vapor deposition) on the surface of the PcBN substrate, an inner titanium carbonitride coating layer applied by MT-CVD to the surface of the MT-CVD titanium nitride base coating layer, a titanium oxycarbonitride coating layer applied by MT-CVD to the surface of the inner MT-CVD titanium carbonitride coating layer, an alpha-alumina coating layer applied by MT-CVD to the surface of the titanium oxycarbonitride coating layer, an outer titanium carbonitride coating layer applied by MT-CVD to the surface of the alpha-alumina coating layer, and an outer titanium nitride coating layer applied by MT-CVD to the surface of the outer MT-CVD titanium carbonitride coating layer.
Figure 4A:
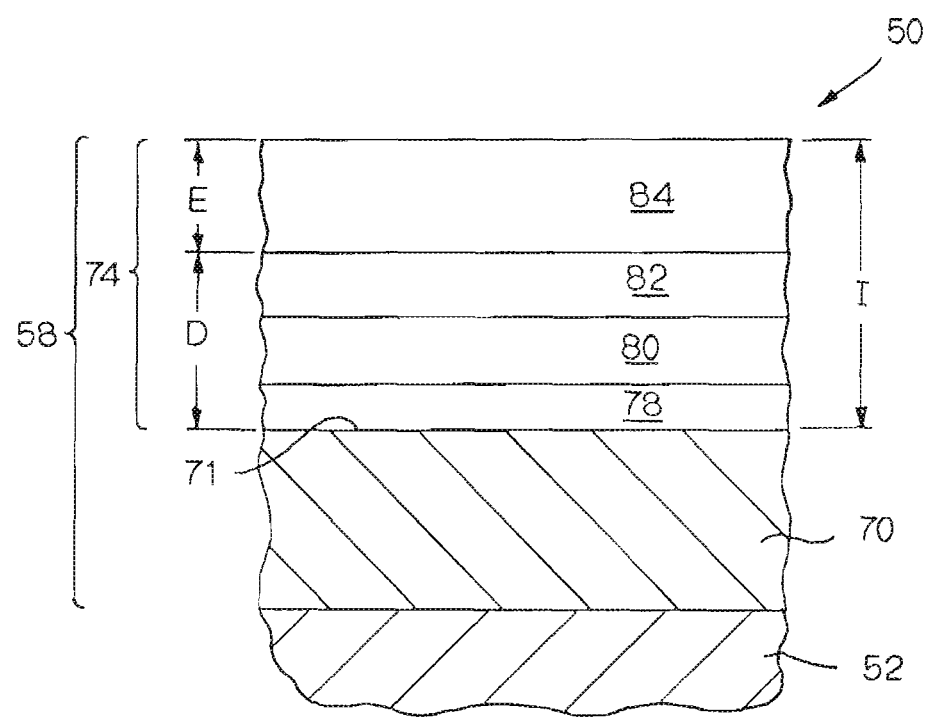
FIG. 4A is a cross-sectional view of the coated PcBN cutting tool of FIG. 2 showing the coated PcBN cutting insert in one alternative of a post-blasted condition wherein substantially all of the titanium-containing outer coating region (i.e., the outer MT-CVD titanium carbonitride coating layer and the outer titanium nitride coating layer) has been removed and substantially all of the alpha-alumina coating layer remains, i.e., has not been blasted off or has been removed to a minimal extent.
Figure 4B:
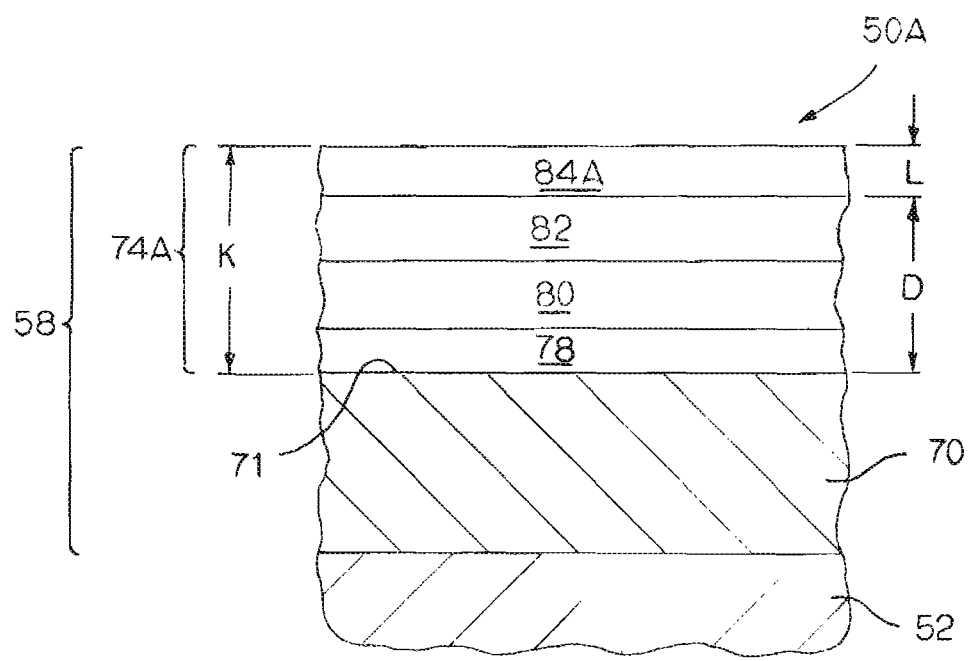
FIG. 4B is a cross-sectional view of the coated PcBN cutting tool of FIG. 2 showing the coated PcBN cutting insert in another alternative of a post-blasted condition wherein substantially all of the titanium-containing outer coating region (i.e., the outer MT-CVD titanium carbonitride coating layer and the MT-CVD outer titanium nitride coating layer) has been removed and some, i.e., more than a minimal amount, of the MT-CVD alpha-alumina coating layer has been removed via blasting.

As mentioned herein above, the one specific embodiment of the coated PcBN cutting tool 50 comprises a coated PcBN cutting insert 58 with a post-blasted coating scheme thereon. There are least two alternatives for the post-blasted coating scheme. FIG. 4A illustrates one such alternative and FIG. 4B illustrates another such alternative. The post-blasted coating scheme is the result of wet blasting a pre-blasted coating scheme on the PcBN substrate. FIG. 3 illustrates the general coating architecture of the pre-blasted coating scheme as shown by bracket 76.

In general, the pre-blasted coating scheme 76 comprises the following coating layers. The coating layer next to the PcBN cutting insert substrate is a titanium nitride base coating layer 78 (see FIG. 3) applied by MT-CVD on the surface 71 of the PcBN substrate 70. Generally speaking herein, a MT-CVD process occurs at a temperature range of between about 750° C. and about 950° C.

Referring to FIG. 3, the thickness of the titanium nitride base coating layer is thickness "A", which is 0.5 micrometers. A number of ranges of the thickness of the titanium nitride coating layer 78 are acceptable. In one alternative, thickness "A" can range between greater than about 0 micrometers (μm) and about 3 micrometers (μm). Another alternative of the thickness "A" comprises a range between greater than about 0 micrometers (μm) and about 2 micrometers (μm). Still another alternative of the thickness "A" comprises between greater than about 0 micrometers (μm) and about 1 micrometers (μm).

The titanium nitride base coating layer 78 can be on the entire surface of the PcBN substrate 70. In the alternative, titanium nitride base coating layer 78 can be on those areas of the surface of the PcBN substrate 70 that experience wear during the removal of material from the workpiece. Typically, such wear occurs at the cutting edge and on the rake face near the cutting edge and on the flank surface(s) near the cutting edge.

The next coating layer is an inner titanium carbonitride coating the titanium nitride base coating layer 80. Referring to FIG. 3, the thickness of the inner MT-CVD titanium carbonitride coating layer 80 applied by MT-CVD to the surface of is thickness "B", which is 11 micrometers. A number of ranges of the thickness of the MT-CVD titanium carbonitride coating layer 80 are acceptable. In one alternative, thickness "B" can range between about 2 micrometers (μm) and about 25 micrometers (μm). Another alternative of the thickness "B" comprises a range between about 4 micrometers (μm) and about 15 micrometers (μm). Still another alternative of the thickness "B" comprises between about 6 micrometers (μm) and about 12 micrometers (μm).

The next coating layer is a titanium oxycarbonitride coating layer 82 applied by MT-CVD to the surface of the inner MT-CVD titanium carbonitride coating layer 80. Referring to FIG. 3, the thickness of the MT-CVD titanium oxycarbonitride coating layer 82 is thickness "C", which is 1 micrometer. A number of ranges of the thickness "C" of the mediate titanium oxycarbonitride coating layer 82 are acceptable. In one alternative, thickness "C" can range between greater than about 0 micrometers (μm) and about 5 micrometer (μm). Another alternative of the thickness "C" comprises a range between greater than about 0 micrometer (μm) and about 3 micrometers (μm). Still another alternative of the thickness "C" comprises between greater than about 0 micrometer (μm) and about 2 micrometers (μm).

The combination of the titanium nitride base coating layer 78, the inner MT-CVD titanium carbonitride coating layer 80 and the titanium oxycarbonitride coating layer 82 comprises an inner titanium-containing coating layer region 94. There should be an appreciation that the inner titanium-containing coating layer region 94 may be considered to be an inner coating layer region. The inner titanium-containing coating layer region 94 has a thickness "D", which is 12 micrometers (μm). Thickness "D" of the inner titanium-containing coating region 94 can range in one alternative between about 3 micrometers (μm) and about 27 micrometers (μm). Another alternative of the thickness "D" comprises between about 5 micrometers (μm) and about 16 micrometers (μm). Still another alternative of the thickness "D" comprises between about 7 micrometers (μm) and about 13 micrometers (μm).

The next coating layer is an alpha-alumina coating layer 84 applied by MT-CVD to the surface of the titanium oxycarbonitride coating layer 82. The alpha-alumina coating layer 84 is illustrated in FIG. 3 as comprising a single alumina coating layer. In this embodiment, the single alpha-alumina coating layer 84 can be considered to be the alpha-alumina coating layer region. As an alternative, the alpha-alumina coating layer region 84 may comprise a plurality of coating sets and an outermost alumina coating layer. In this alternative, each coating set may comprise, for example, an alumina coating layer and a titanium oxycarbonitride coating layer. As is apparent, applicants contemplate that other coating layers, whether it is the coating layer architecture or the composition of the coating layers, may comprise the alumina-containing base layer region so the above specific embodiments should not be restrictive of the scope of the claims. However, the one aspect of the alumina-containing base layer region is that the outermost coating layer thereof is an alumina coating layer.

The thickness "E" of the alpha-alumina coating layer 84 is 8 micrometers (μm). The thickness "E" can range in one alternative between about 1 micrometer (μm) and about 15 micrometers (μm). Another alternative range of the thickness "E" of the alpha-alumina coating layer 84 comprises between about 2 micrometers (μm) and about 12 micrometers (μm). Yet, another alternative range "E" of the thickness of the alpha-alumina coating layer 84 comprises between about 4 micrometers (μm) and about 10 micrometers (μm).

The next coating layer is an outer titanium carbonitride coating layer 86 applied by MT-CVD to the surface of the alpha-alumina coating layer 84. Referring to FIG. 3, the thickness of the outer MT-CVD titanium carbonitride coating layer 86 is thickness "F", which is 0.5 micrometer. A number of ranges of the thickness "F" of the outer MT-CVD titanium carbonitride coating layer 86 are acceptable. In one alternative, thickness "F" can range between greater than about 0 micrometers (μm) and about 5 micrometers (μm). Another alternative of the thickness "F" comprises a range between about 0.2 micrometers (μm) and about 3 micrometers (μm). Still another alternative of the thickness "F" comprises between about 0.2 micrometers (μm) and about 2 micrometers (μm).

The outermost coating layer of the pre-blasted coating scheme 76 is an outer titanium nitride coating layer 88 applied by MT-CVD to the surface of the outer MT-CVD titanium carbonitride coating layer 86. Referring to FIG. 3, the thickness of the outer titanium nitride coating layer 88 is thickness "G", which is 0.5 micrometer. A number of ranges of the thickness of the outer MT-CVD titanium nitride coating layer 88 are acceptable. In one alternative, thickness "G" can range between greater than about 0 micrometer (μm) and about 5 micrometers (μm). Another alternative of the thickness "G" comprises a range between about 0.2 micrometer (μm) and about 3 micrometers (μm). Still another alternative of the thickness "G" comprises between about 0.2 micrometer (μm) and about 2 micrometers (μm).

The combination of the outer MT-CVD titanium carbonitride coating layer 86 and the outer MT-CVD titanium nitride coating layer 88 comprises an outer titanium-containing coating layer region 100. Referring to FIG. 3, the thickness of the outer titanium-containing coating region 100 is thickness "H", which is equal to about 1 micrometer (μm). Thickness "H" of the outer titanium-containing coating region 100 can range in one alternative between about 0.2 micrometers (μm) and about 5 micrometers (μm). Another alternative of the thickness "H" comprises between about 0.2 micrometer (μm) and about 3 micrometer (μm). Still another alternative of the thickness "H" comprises between about 0.2 micrometers (μm) and about 2 micrometers (μm).

The overall coating thickness for the pre-blasted coating scheme 76 is thickness "J", which is equal to about 22 micrometers (μm). Thickness "J" of the pre-blasted coating scheme can range in one alternative between about 5 micrometers (μm) and about 35 micrometers (μm). Another alternative range of the thickness "J" comprises between about 5 micrometers (μm) and about 25 micrometers (μm). Still another alternative range of the thickness "J" comprises between about 8 micrometers (μm) and about 15 micrometers (μm).

As will become apparent from the description hereinafter, the process to produce the post-blasted coating scheme includes a post-coating wet blasting step. Typically, the post-coating wet blasting step comprises pneumatically projecting alumina particles in a liquid (e.g., water) slurry to impinge selected surfaces or, in one alternative, all surfaces of the pre-blasted coating scheme. In this post-coating wet blasting step, wet blasting removes from all surfaces (or at least all surface areas impinged upon) substantially all the titanium-containing outer coating layer region 100. In one alternative of the wet blasting step, substantially all of the alumina coating layer 84 remains. FIG. 4A shows the post-blasted coating scheme 74 for this alternative. In another alternative of the wet blasting step, some the alumina coating layer 84 is removed through wet blasting whereby the result is the alumina coating layer 84A. FIG. 4B shows the post-blasted coating scheme 74A for this alternative.

One result of the wet blasting is the exposure of the underlying as-deposited alumina coating layer to form the exposed alumina coating layer of the post-blasted coating scheme. The post-coating wet blasting step further reduces the tensile stress in the exposed alumina coating layer to a lower tensile stress or converts the tensile stress to compressive stress. The post-coating wet blasting step also smoothens the surface of the exposed alumina coating layer. It is clear that the wet blasting step both reduces the stress condition of the exposed alumina coating layer and smoothens the surface of the exposed alumina coating layer.

Referring to the first alternative as illustrated in FIG. 4A, the post-coating wet blasting step removes substantially all the titanium-containing outer coating layer region 100, but leaves substantially all of the alumina coating layer 84, as well as all of the coating layers between the alumina coating layer 84 and the substrate. Thus, the thickness "E" of the alumina coating layer 84 remains substantially unchanged. The overall thickness of the post-blasted coating scheme 74 is dimension "I", which is equal to about 21 micrometers (μm). Thickness "I" of the overall post-blasted coating scheme 74 can range in one alternative between about 4 micrometers (μm) and about 34 micrometers (μm). Another alternative range of the thickness "I" comprises between about 4 micrometers (μm) and about 24 micrometers (μm). Still another alternative range of the thickness "I" comprises between about 5 micrometers (μm) and about 14 micrometers (μm).

Referring to the second alternative as illustrated in FIG. 4B (which is shown as PcBN cutting tool 50A), the post-coating wet blasting step removes all the titanium-containing outer coating layer region 100 and some of the alumina coating layer 84 to result in alumina coating layer 84A, which is the outermost coating layer of the second alternative. The alumina coating layer 84A has a thickness "L", which is equal to about 6 micrometers (μm). The magnitude of thickness "L" is less than the magnitude of thickness "E". Thickness "L" can range in one alternative between about 1 micrometers (μm) and about 13 micrometers (μm). Another alternative range of the thickness "L" comprises between about 2 micrometers (μm) and about 10 micrometers (μm). Still another alternative range of the thickness "L" comprises between about 4 micrometers (μm) and about 8 micrometers (μm).

Still referring to FIG. 4B, the post-blasted coating scheme 74A has a thickness "K", which is equal to about 20 micrometers (μm). Thickness "K" can range in one alternative between about 4 micrometers (μm) and about 32 micrometers (μm). Another alternative range of the thickness "K" comprises between about 4 micrometers (μm) and about 22 micrometers (μm). Still another alternative range of the thickness "K" comprises between about 5 micrometers (μm) and about 12 micrometers (μm).

The outermost alumina coating layer 84 (as-deposited) has a tensile stress. The post-coating wet blasting step reduces the magnitude of the tensile stress from a pre-blasted tensile stress level to a post-blasted tensile stress level. The pre-blasted tensile stress level is greater than the post-blasted tensile stress level. The post-coating wet blasting step may also convert the tensile stress to compressive stress wherein this is a change from a pre-blasted tensile stress level to a post-blasted compressive stress level. This has the result of the exposed alumina coating layer exhibiting a reduced tensile stress, which has a value less than the tensile stress in the as-deposited outermost alumina coating layer, or exhibiting a compressive stress.

The post-coating wet blasting step also leads to smoothening of the exposed alumina coating layer (84 or 84A). In one alternative, the exposed alumina coating layer exhibits a surface roughness $R_a$ of between about 0.2 μm and about 0.8 μm using a WYKO measurement technique. In another alternative, the exposed alumina coating layer exhibits a surface roughness $R_a$ of between about 0.2 μm and about 0.6 μm using a WYKO measurement technique. In still another alternative, the exposed alumina coating layer exhibits a surface roughness $R_a$ of between about 0.2 μm and about 0.5 μm using a WYKO measurement technique. In regard to the WYKO technique, a sampling area of 0.3 mm by 0.2 mm was chosen in WYKO measurement under the Vertical Scanning Interferometry mode.

In one alternative of the wear-resistant coating scheme, the as-deposited outermost alumina coating layer, which becomes the exposed alumina coating layer after wet blasting, exhibits a pre-blasted (or as-deposited) tensile stress condition equal to between about 50 MPa to about 800 MPa. After completion of the wet blasting, the exposed alumina coating layer has a post-blasted stress condition of between 50 MPa (tensile stress) to about −2 GPa (compressive stress).

In another alternative of the wear-resistant coating scheme, the as-deposited outermost alumina coating layer, which becomes the exposed alumina coating layer after wet blasting, exhibits a pre-blasted (or as-deposited) tensile stress condition equal to between about 100 MPa to about 600 MPa. After completion of the wet blasting, the exposed alumina coating layer has a post-blasted stress condition of between −50 MPa (compressive stress) to about −800 MPa (compressive stress).

In another alternative of the wear-resistant coating scheme, the as-deposited outermost alumina coating layer, which becomes the exposed alumina coating layer after wet blasting, exhibits a pre-blasted (or as-deposited) tensile stress condition equal to between about 100 MPa to about 450 MPa. After completion of the wet blasting, the exposed alumina coating layer has a post-blasted stress condition of between −100 MPa (compressive stress) to about −400 MPa (compressive stress).

In reference to the measurement technique for the stress, the technique is x-ray diffraction (XRD) technique. The XRD stress measurement is based upon the Psi tilt method and the refection (024) of $Al_2O_3$ coating layer was chosen for measurement. Psi tilts of 0 degrees, 33.9 degrees, 52.1 degrees and 75 degrees were selected for the measurement of the residual stress levels. Positive and negative Psi tilts were chosen to supply the data required to determine possible shear stresses. Additionally, three Phi rotation angles were selected (0 degrees, 45 degrees, and 90 degrees) to provide the data required to determine the biaxial stress state of the material.

Biaxial stress calculations were completed using the following equation:

$$\frac{d_{\varphi\psi} - d_0}{d_0} = S_1(\sigma_1 + \sigma_2) + \frac{1}{2} S_2 \sigma_\varphi \sin^2 \psi$$

where:
$S_1$ and ½ $S_2$ are the x-ray elastic constants
$d_{\varphi\psi}$ measured peak d-spacing for the Psi tilt and Phi rotation
$d_0$ stress free peak d-spacing for diffracted reflection
$\sigma_1$ and $\sigma_2$ are the primary stresses $$\sigma_1 = \sigma_1 \cos^2 \phi + \sigma_2 \sin^2 \phi$$

Figure 5:
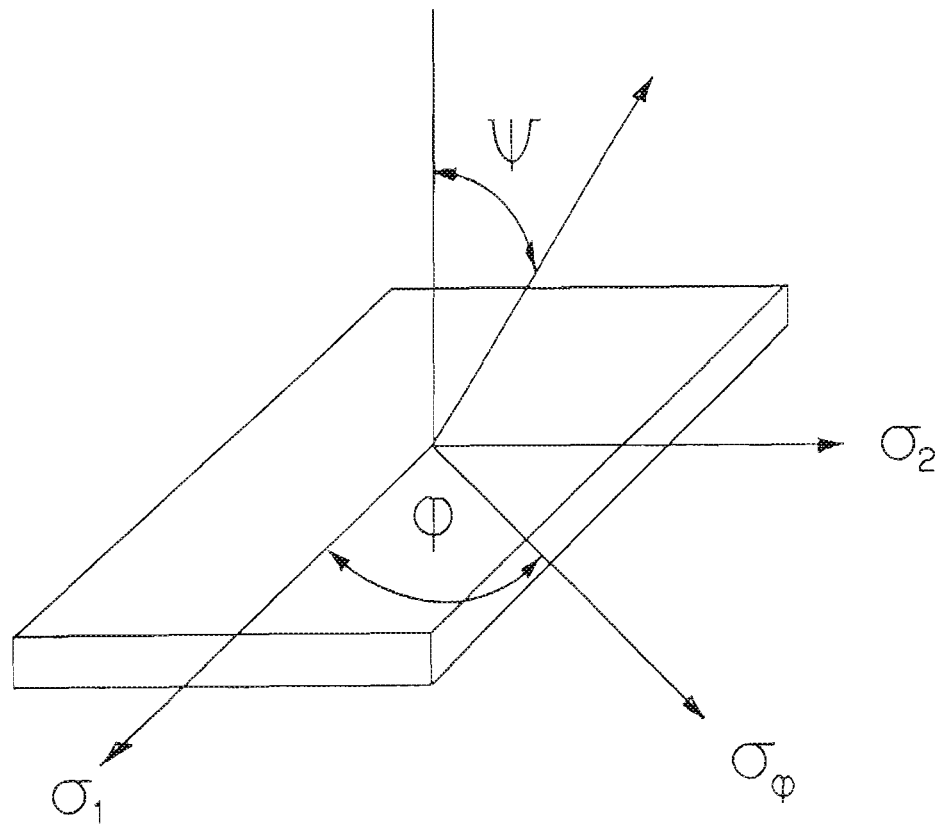
FIG. 5 is a drawing that shows the relationships between the various tilt and rotation angles in the measurement of the stress condition in the coating layers via an x-ray diffraction (XRD) technique using the Psi tilt method.

The relationship of the various tilt and rotation angles in this method is shown in FIG. 5. Young's Modulus (E) is taken to be 401 GPa, Poisson's Ratio (ν) is taken to be 0.22, and x-ray elastic constants ($S_1$ and $S_2$) are taken to be $-0.53 \times 10^6$ mm²/N and $2.94 \times 10^6$ mm²/N respectively for calculation of stress in $Al_2O_3$ coating.

The wet blasting is accomplished using a slurry comprising alumina particulates and water. The slurry of alumina particulates and water is pneumatically projected at the surface to impinge the surface of the substrate.

The fundamental parameters of the alumina-water slurry are grit (i.e., alumina particles) concentration in volume percent, and alumina particle size in micrometers (μm). In one alternative, the slurry comprises between about 5 volume percent and about 35 volume percent alumina particulates with the balance water. In another alternative, the slurry comprises between about 8 volume percent and about 25 volume percent alumina particulates with the balance water. In still another alternative, the slurry comprises between about 10 volume percent and about 15 volume percent alumina particulates with the balance water. For the particle size, in one alternative, the alumina particles can range in size between about 20 μm and about 100 μm. In another alternative, the alumina particles can range in size between about 35 μM and about 75 μm. In still another alternative, the alumina particles can range in size between about 45 μm and about 50 μm.

The operating parameters for the wet blasting step are pressure, angle of impingement, and duration. In this application, the angle of impingement is about ninety degrees, i.e., the particles impinge the surface at a ninety degree angle. In one alternative, the pressure ranges between about 30 pounds per square inch (psi) and about 55 psi. In another alternative, the pressure ranges between about 40 pounds per square inch (psi) and about 50 psi. The duration of the wet blasting varies with the specific wet blasting operation wherein the goal is to achieve complete (or substantially complete) removal of the titanium containing outer coating layer region. Exemplary durations comprise between about 6 seconds and about 45 seconds. One range of duration is between about 9 seconds and about 30 seconds. Still another range of duration is between about 12 seconds and about 21 seconds.

In reference to a method of making a coated cutting insert, the basic steps are set forth below. The first step is to provide a polycrystalline cubic boron nitride substrate wherein the substrate has a rake surface and at least one flank surface, and a cutting edge is at the juncture between the rake surface and the flank surface.

The next step is to deposit on at least some of the rake surface and at least some of the flank surface of the polycrystalline cubic boron nitride substrate by chemical vapor deposition an inner titanium-containing coating layer region, which can be considered as an inner coating layer region. In one embodiment, the titanium-containing base coating layer region comprises three separate coating layers. The first layer is a titanium nitride base coating layer applied by MT-CVD to the surface of the substrate. The second coating layer is a titanium carbonitride coating layer applied by MT-CVD to the titanium nitride coating layer. The third coating layer is a titanium oxycarbonitride coating layer applied by MT-CVD to the titanium carbonitride coating layer.

The next step is to deposit on the inner titanium-containing coating region by chemical vapor deposition an alumina-containing coating region wherein the alumina-containing coating region layer comprises at least one outermost alumina coating layer. There should be an appreciation that the alumina-containing base layer region may consist essentially of the outermost alumina coating layer. An another alternative, there should be an appreciation that the alumina-containing base layer region may consist essentially of a plurality of coating sets and the outermost alumina coating layer, and each coating set comprising an alumina coating layer and a titanium oxycarbonitride coating layer.

The next step is to deposit on the alumina-containing coating layer region by chemical vapor deposition an outer titanium-containing coating layer region. In one embodiment, the outer titanium-containing coating layer region comprises an outer titanium carbonitride coating layer applied by MT-CVD to the outermost alumina coating layer and an outer titanium nitride coating layer applied by MT-CVD to the surface of the outer MT-CVD titanium carbonitride coating layer.

The next step is to wet blast off the titanium-containing outer coating layer region thereby exposing the outermost alumina (e.g., alpha-alumina) coating layer to form an exposed alumina coating layer and changing the stress condition of the exposed outermost alumina coating layer from an initial tensile stress condition ranging between about 50 MPa and about 800 MPa as measured by as measured by XRD using the Psi tilt method and the (024) reflection of alumina to a blasted stress condition with stress ranging between about 50 MPa (tensile) and about −2 GPa (compressive) as measured by XRD using the Psi tilt method and the (024) reflection of alumina and wherein the initial tensile stress condition is greater than the blasted stress condition of tensile stress. There should be an appreciation that the wet blasting step may remove only the titanium-containing outer coating layer region thereby leaving substantially all of the alumina-containing coating layer region. There should also be an appreciation that in another alternative, the wet blasting step can remove the titanium-containing outer coating layer region along with some of the alumina-containing coating layer region.

Specific examples of the inventive coated PcBN cutting tool, which uses the inventive coated PcBN cutting insert were tested against other PcBN cutting tools. These comparative tests measured the tool life in minutes of (1) an uncoated PcBN cutting tool, (2) a coated PcBN cutting tool wherein the coating was not subjected to wet blasting, and (3) an inventive coated PcBN cutting tool wherein the coating was subjected to wet blasting. Table 3 sets forth the details of the coating process to coat the PcBN cutting insert substrate, which was a component of the PcBN cutting tool.

TABLE 3

Process Steps for Coating PcBN Substrate

| Material | Temperature Range (° C.) | Pressure Range (mb) | Total Time (Minutes) | Gases Present |
| --- | --- | --- | --- | --- |
| TiN (outermost coating layer) | 800-900 | 80-500 | 110 | TiCl$_4$, H$_2$, N$_2$, |
| TiCN | 800-900 | 80-500 | 125 | TiCl$_4$, CH$_4$, H$_2$, N$_2$, HCl |
| alpha-Alumina | 800-900 | 55-160 | 420 | AlCl$_3$, CO$_2$, H$_2$, H$_2$S, HCl |
| TiOCN | 800-900 | 80-500 | 180 | TiCl$_4$, CH$_4$, H$_2$, N$_2$, HCl, CO, CH$_3$CN |
| TiCN | 770-900 | 55-100 | 210 | TiCl$_4$, H$_2$, N$_2$, CH$_3$CN, HCl |
| TiN (innermost coating layer) | 800-900 | 80-160 | 45 | TiCl$_4$, H$_2$, N$_2$ |
| PcBN-SUBSTRATE | PcBN-SUBSTRATE | PcBN-SUBSTRATE | PcBN-SUBSTRATE | PcBN-SUBSTRATE |

For the PcBN cutting insert subjected to wet blasting, the wet blasting procedure is set forth in Table 4 below.

TABLE 4

Post-Coating Blasting Parameters

| Parameter | Description |
| --- | --- |
| Composition of the alumina particle-water slurry | 20% |
| Size of the alumina particles | 25-50 μm |
| Pressure during the impingement process | 35-40 psi |
| Duration of the Impingement | 9 seconds |

For all of the PcBN cutting tools, the basic geometry or style was ANSI Standard CNGA432S0420MT. The parameters of the specific coated cutting inserts used in the comparative tests are set forth in Table 5 below.

TABLE 5

Specific Parameters for the Coated PcBN Cutting Tool

| Parameter | Description/Details of Uncoated PcBN Cutting Tool | Description/Details of Coated PcBN Cutting Tool without Wet Blasting | Description/Details of Coated PcBN Cutting Tool with Wet Blasting |
|---|---|---|---|
| Geometry | CNGA432S0420MT | CNGA432S0420MT | CNGA432S0420MT |
| Support Composition | WC 85 wt % Co 15 wt % | WC 85 wt % Co 15 wt % | WC 85 wt % Co 15 wt % |
| Composition of the PcBN substrate | 85 wt % PCBN, remainder as binder and minor constituents | 85 wt % PCBN, remainder as binder and minor constituents | 85 wt % PCBN, remainder as binder and minor constituents |
| titanium-containing inner coating region | Not Present | 13 µm thickness (TiN: 0.5 µm, TiCN: 12.7 µm) | 13 µm thickness (TiN: 0.5 µm, TiCN: 12.7 µm) |
| alumina-containing coating layer region | Not Present | 8 µm thickness | 8 µm thickness |
| titanium-containing outer coating region | Not Present | 1.7 µm thickness | Not Present |

For the comparative testing measuring tool life, the parameters were as follows: workpiece material: Class G2 gray cast iron; speed equal to 2000 surface feet per minute (sfm) (610 surface meters per minute); a feed rate equal to 0.009 inch (0.23 millimeters) per revolution (ipr); a depth of cut (doc) equal to 0.025 inch (0.64 millimeters); a lead angle equal to −5 degrees; and coolant: dry. Minutes per cycle equal to 1 minute and passes per cycle equal to 30. The failure criteria were: UW equal to 0.02 inches (0.51 millimeters) maximum; nose wear (NW) equal to 0.02 inches (0.51 millimeters); depth of cut notching (DN) equal to 0.02 inches (0.51 millimeters); CR equal to 0.004 inches (0.1 millimeters); and TW equal to 0.02 inches (0.51 millimeters).

In the comparative testing, six samples, i.e., three prior art coated cutting inserts and three inventive coated cutting inserts, were run. The results of the comparative testing are set forth in Table 6 below.

TABLE 6

Tool Life Results from Comparative Testing

| PcBN Cutting Tool | Tool Life (Minutes)/Failure Mode |
|---|---|
| Uncoated PcBN Cutting Tool | 4.0/NW |
| Coated PcBN Cutting Tool without Wet Blasting | 11.5/NW |
| Coated PcBN Cutting Tool With Wet Blasting | 16.0/NW |

These results show four times improvement in the life time (tool life) of the inventive cutting inserts in the wear resistance as compared to the wear resistance of the prior art cutting insert.

Figure 6:
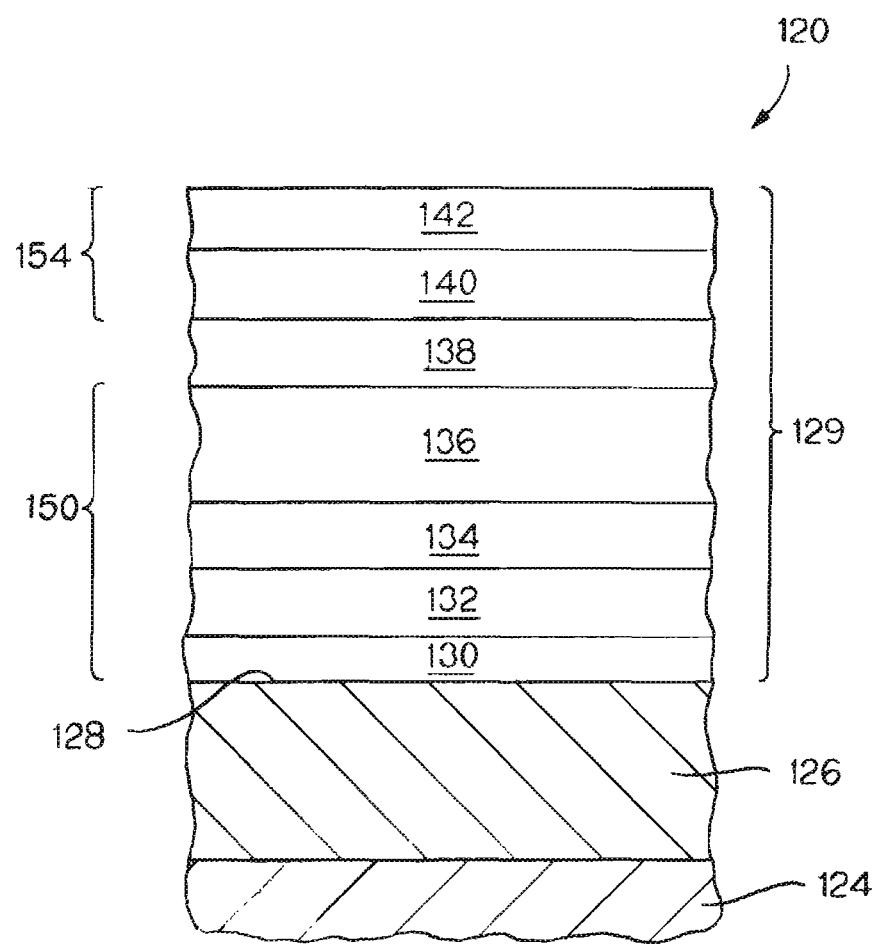
FIG. 6 is a cross-sectional view of another specific embodiment of a coated PcBN cutting tool of the invention in a pre-blasted condition wherein the PcBN substrate has deposited thereon via chemical vapor deposition the following coating scheme: an aluminum oxide base coating layer applied by CVD on the surface of the PcBN substrate, a titanium nitride coating layer applied by MT-CVD (moderate temperature chemical vapor deposition), an inner titanium carbonitride coating layer applied by MT-CVD to the surface of the MT-CVD titanium nitride coating layer, a titanium oxycarbonitride coating layer applied by MT-CVD to the surface of the inner MT-CVD titanium carbonitride coating layer, an alpha-alumina coating layer applied by MT-CVD to the surface of the titanium oxycarbonitride coating layer, an outer titanium carbonitride coating layer applied by MT-CVD to the surface of the alpha-alumina coating layer, and an outer titanium nitride coating layer applied by MT-CVD to the surface of the outer MT-CVD titanium carbonitride coating layer.

Referring to FIG. 6, there is illustrated another specific embodiment of the coated PcBN cutting tool generally designated as 120. The coated PcBN cutting tool 120 comprises a support (e.g., cemented (cobalt) tungsten carbide) 124, which has a PcBN substrate 126 on the surface thereof. FIG. 6 illustrates the coated PcBN cutting tool 120 in a pre-blasted condition wherein the PcBN substrate has deposited thereon via chemical vapor deposition a multi-layer pre-blasted coating scheme 129.

The pre-blasted coating scheme 129 comprises the following coating layers. The first coating layer is an aluminum oxide base coating layer 130 applied by CVD on the surface 128 of the PcBN substrate 126. The preferred thickness of the aluminum oxide coating layer 130 is about 0.5 micrometers. A number of ranges of the thickness of the aluminum oxide base coating layer 130 are acceptable. In one alternative, the thickness can range between greater than about 0 micrometers (µm) and about 3 micrometers (µm). Another alternative of the thickness comprises a range between greater than about 0, micrometer (µm) and about 1 micrometers (µm).

The coating scheme 129 further includes an inner titanium nitride coating layer 132 applied by MT-CVD (moderate temperature chemical vapor deposition) to the surface of the aluminum oxide base coating layer 130. A preferred thickness of the inner titanium nitride coating layer 132 is about 0.5 micrometers. A number of ranges of the thickness of the inner titanium nitride coating layer 132 are acceptable. In one alternative, the thickness can range between greater than about 0 micrometers (µm) and about 3 micrometers (µm). Another alternative of the thickness comprises a range between greater than about 0 micrometers (µm) and about 2 micrometers (µm). Still another alternative of the thickness comprises between greater than about 0 micrometers (µm) and about 1 micrometers (µm).

The coating scheme also includes an inner titanium carbonitride coating layer 134 applied by MT-CVD to the surface of the inner MT-CVD titanium nitride coating layer 132. The thickness of the inner MT-CVD titanium carbonitride coating layer 134 is about 11 micrometers. A number of ranges of the thickness of the MT-CVD titanium carbonitride coating layer 134 are acceptable. In one alternative, the thickness can range between about 2 micrometers (µm) and about 25 micrometers (µm). Another alternative of the thickness comprises a range between about 4 micrometers (µm) and about 15 micrometers (µm). Still another alternative of the thickness comprises between about 6 micrometers (µm) and about 12 micrometers (µm).

A titanium oxycarbonitride coating layer 136 is applied by MT-CVD to the surface of the inner MT-CVD titanium carbonitride coating layer 134. The thickness of the MT-CVD titanium oxycarbonitride coating layer 136 is about 1 micrometer. A number of ranges of the thickness of the titanium oxycarbonitride coating layer 136 are acceptable. In one alternative, the thickness can range between greater than about 0 micrometers (μm) and about 5 micrometer (μm). Another alternative of the thickness comprises a range between greater than about 0 micrometer (μm) and about 3 micrometers (μm). Still another alternative of the thickness comprises between greater than about 0 micrometer (μm) and about 2 micrometers (μm).

The combination of the aluminum oxide base coating layer 130, the inner titanium nitride coating layer 132, the inner MT-CVD coating layer 134 and the titanium oxycarbonitride coating layer 136 comprises an inner titanium/aluminum-containing coating layer region 150. There should be an appreciation that the inner titanium/aluminum coating layer region 150 may be considered an inner coating layer region. The inner titanium/aluminum-containing coating layer region 150 has a thickness equal to about 13 micrometers (μm). The thickness of the inner titanium-containing coating region can range in one alternative between about 3 micrometers (μm) and about 27 micrometers (μm). Another alternative of the thickness comprises between about 5 micrometers (μm) and about 16 micrometers (μm). Still another alternative of the thickness comprises between about 7 micrometers (μm) and about 13 micrometers (μm).

The next coating layer is an alpha-alumina coating layer 138 applied by MT-CVD to the surface of the titanium oxycarbonitride coating layer 136. The alpha-alumina coating layer 138 is illustrated in FIG. 6 as comprising a single alumina coating layer. In this embodiment, the single alpha-alumina coating layer 138 can be considered to be the alumina coating layer region. As an alternative, the alumina coating layer region may comprise a plurality of coating sets and an outermost alumina coating layer. In this alternative, each coating set may comprise, for example, an alumina coating layer and a titanium oxycarbonitride coating layer. As is apparent, applicants contemplate that other coating layers, whether it is the coating layer architecture or the composition of the coating layers, may comprise the alumina-containing coating layer region so the above specific embodiments should not be restrictive of the scope of the claims. However, the one aspect of the alumina-containing layer region is that the outermost coating layer is an alumina coating layer.

The thickness of the alpha-alumina coating layer 138 is 8 micrometers (μm). The thickness can range in one alternative between about 1 micrometer (μm) and about 15 micrometers (μm). Another alternative range of the thickness of the alpha-alumina coating layer 138 comprises between about 2 micrometers (μm) and about 12 micrometers (μm). Yet, another alternative range of the thickness of the alpha-alumina coating layer 138 comprises between about 4 micrometers (μm) and about 10 micrometers (μm).

The next coating layer is an outer titanium carbonitride coating layer 140 applied by MT-CVD to the surface of the alpha-alumina coating layer 138. Referring to FIG. 6, the thickness of the alpha-alumina coating layer is about 0.5 micrometer. A number of ranges of the thickness of the outer MT-CVD titanium carbonitride coating layer 140 are acceptable. In one alternative, the thickness can range between greater than about 0 micrometers (μm) and about 5 micrometers (μm). Another alternative of the thickness comprises a range between about 0.2 micrometers (μm) and about 3 micrometers (μm). Still another alternative of the thickness comprises between about 0.2 micrometers (μm) and about 2 micrometers (μm).

The outermost coating layer of the coating scheme 129 is an outer titanium nitride coating layer 142 applied by MT-CVD to the surface of the outer MT-CVD titanium carbonitride coating layer 140. Referring to FIG. 6, the thickness of the outer titanium nitride coating layer is about 0.5 micrometer. A number of ranges of the thickness of the outer MT-CVD titanium nitride coating layer 142 are acceptable. In one alternative, the thickness can range between greater than about 0 micrometer (μm) and about 5 micrometers (μm). Another alternative of the thickness comprises a range between about 0.2 micrometer (μm) and about 3 micrometers (μm). Still another alternative of the thickness comprises between about 0.2 micrometer (μm) and about 2 micrometers (μm).

The combination of the outer MT-CVD titanium carbonitride coating layer 140 and the outer MT-CVD titanium nitride coating layer 142 comprises an outer titanium-containing coating layer region 154. Referring to FIG. 6, the thickness of the outer titanium-containing coating region 154 is equal to about 1 micrometer (μm). The thickness of the outer titanium-containing coating region 154 can range in one alternative between about 0.2 micrometers (μm) and about 5 micrometers (μm). Another alternative of the thickness comprises between about 0.2 micrometer (μm) and about 3 micrometer (μm). Still another alternative of the thickness comprises between about 0.2 micrometers (μm) and about 2 micrometers (μm).

Figure 7:
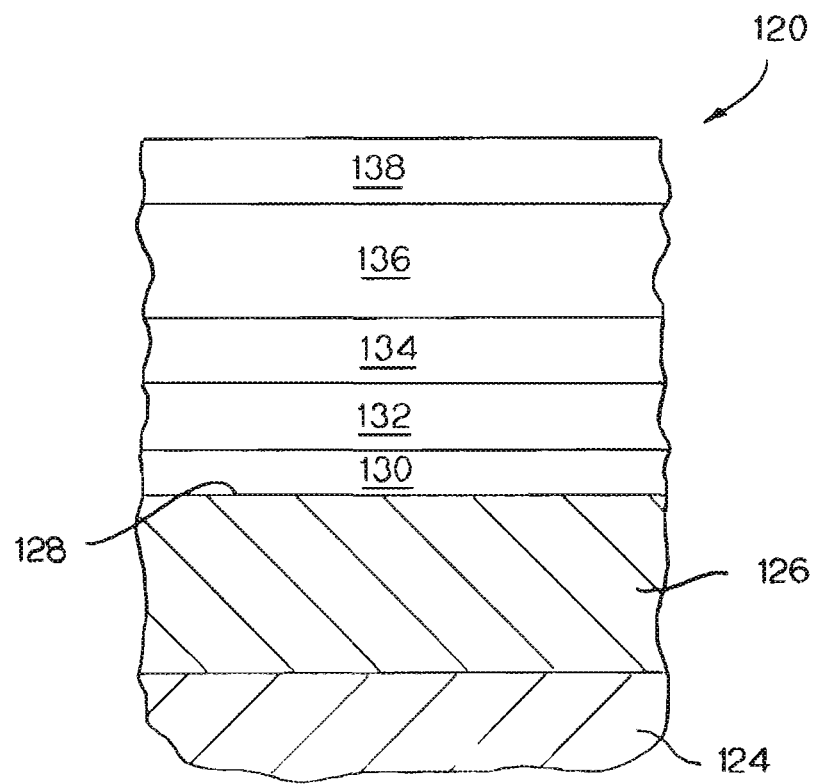
FIG. 7 is a cross-sectional view of the coated PcBN cutting tool of FIG. 6 showing the coated PcBN cutting insert in a post-blasted condition wherein substantially all of the titanium-containing outer coating region (i.e., the outer MT-CVD titanium carbonitride coating layer and the outer titanium nitride coating layer) has been removed and substantially all of the alpha-alumina coating layer remains, i.e., has not been blasted off or has been removed to a minimal extent.

FIG. 7 is a cross-sectional view of the coated PcBN cutting tool of FIG. 6 showing the coated PcBN cutting insert in a post-blasted condition wherein substantially all of the titanium-containing MT-CVD outer coating region (i.e., the outer MT-CVD titanium carbonitride coating layer and the outer titanium nitride coating layer) has been removed and substantially all of the alpha-alumina coating layer remains, i.e., has not been blasted off or has been removed to a minimal extent. The coating layers between the alpha-alumina coating layer and the substrate all remain.

The patents and other documents identified herein are hereby incorporated in their entirety by reference herein. Other embodiments of the invention will be apparent to those skilled in the art from a consideration of the specification or a practice of the invention disclosed herein. There is the intention that the specification and examples are illustrative only and are not intended to be limiting on the scope of the invention. The following claims indicate the true scope and spirit of the invention.

What is claimed:

1. A coated polycrystalline cubic boron nitride cutting insert comprising:
   a polycrystalline cubic boron nitride substrate, the polycrystalline cubic boron nitride substrate having a rake surface and at least one flank surface, and a cutting edge formed at the juncture between the rake surface and the flank surface;
   a wear-resistant coating scheme comprising:
   an inner coating layer region deposited by chemical vapor deposition on at least some of the rake surface and at least some of the flank surface of the polycrystalline cubic boron nitride substrate;
   an alumina-containing coating layer region deposited by chemical vapor deposition on the inner coating layer region, and the alumina-containing coating layer region comprising at least one exposed alumina coating layer; and
   the exposed alumina coating layer exhibiting a post-blasted stress condition ranging between about 50 MPa (tensile stress) and about −2GPa (compressive stress) as measured by XRD using the Psi tilt method and the (024) reflection of alumina.

2. The coated polycrystalline cubic boron nitride cutting insert according to claim 1 wherein the alumina-containing coating layer region consisting essentially of the exposed alumina coating layer.

3. The coated polycrystalline cubic boron nitride cutting insert according to claim 1 wherein the alumina-containing coating layer region consisting essentially of a plurality of coating sets and the exposed alumina coating layer, and each coating set comprising an alumina coating layer and a titanium oxycarbonitride coating layer.

4. The coated polycrystalline cubic boron nitride cutting insert according to claim 1 wherein the exposed alumina coating layer comprising alpha-alumina.

5. The coated polycrystalline cubic boron nitride cutting insert according to claim 1 wherein the post-blasted stress condition of the exposed alumina coating layer being the result of wet blasting, and the wet blasting being accomplished using a slurry comprising alumina particulates and water.

6. The coated polycrystalline cubic boron nitride cutting insert according to claim 5 wherein the slurry comprising between about 5 volume percent and about volume percent alumina particulates and between about 65 volume percent and about 95 volume percent water as measured by slurry sampling and volumetric displacement.

7. The coated polycrystalline cubic boron nitride cutting insert according to claim 1 wherein the post-blasted stress condition of the exposed alumina coating layer ranging between about −50 MPa (compressive stress) and about −800 MPa (compressive stress) as measured by XRD using the Psi tilt method and the (024) reflection of alumina, and the exposed alumina coating layer having an initial stress condition ranging between about 50 MPa (tensile stress) and about 800 MPa (tensile stress) as measured by XRD using the Psi tilt method and the (024) reflection of alumina.

8. The coated polycrystalline cubic boron nitride cutting insert according to claim 1 wherein the post-blasted stress condition of the exposed alumina coating layer ranging between about −100 MPa (compressive stress) and about −400 MPa (compressive stress) as measured by XRD using the Psi tilt method and the (024) reflection of alumina, and the exposed alumina coating layer having an initial tensile stress condition ranging between about 100 MPa (tensile stress) and about 450 MPa (tensile stress) as measured by XRD using the Psi tilt method and the (024) reflection of alumina.

9. The coated polycrystalline cubic boron nitride cutting insert according to claim 1 wherein the exposed alumina coating layer exhibiting a surface roughness $R_a$ between about 0.2 micrometers and about 0.8 micrometers as measured by WYKO in a sampling area equal to 0.3 mm by 0.2 mm using the Vertical Scanning Inferometry Mode.

10. The coated polycrystalline cubic boron nitride cutting insert according to claim 1 wherein the post-blasted stress condition being achieved by wet blasting off an outer titanium-containing coating layer region initially deposited by chemical vapor deposition on the alumina-containing coating layer region thereby changing the stress condition of the exposed alumina coating layer from an initial stress condition ranging between about 50 MPa (tensile stress) and about 800 MPa (tensile stress) as measured by as measured by XRD using the Psi tilt method and the (024) reflection of alumina.

11. The coated polycrystalline cubic boron nitride cutting insert according to claim 1 wherein the inner coating layer region including a base layer of aluminum oxide on the polycrystalline cubic boron nitride substrate.

12. The coated polycrystalline cubic boron nitride cutting insert according to claim 1 wherein the inner coating layer region including a base layer of titanium nitride on the polycrystalline cubic boron nitride substrate.

13. A coated polycrystalline cubic boron nitride cutting tool for removing material from a workpiece, the coated polycrystalline cubic boron nitride cutting tool comprising:
a support and a polycrystalline cubic boron nitride cutting insert on the support, the polycrystalline cubic boron nitride cutting insert comprising:
a polycrystalline cubic boron nitride substrate, the polycrystalline cubic boron nitride substrate having a rake surface and at least one flank surface, and a cutting edge formed at the juncture between the rake surface and the flank surface;
a wear-resistant coating scheme comprising:
an inner coating layer region deposited by chemical vapor deposition on at least some of the rake surface and at least some of the flank surface of the polycrystalline cubic boron nitride substrate;
an alumina-containing coating layer region deposited by chemical vapor deposition on the inner coating layer region, and the alumina-containing coating layer region comprising at least one exposed alumina coating layer; and
the exposed alumina coating layer exhibiting a post-blasted stress condition ranging between about 50 MPa (tensile stress) and about −2 Gpa (compressive stress) as measured by XRD using the Psi tilt method and the (024) reflection of alumina.

14. The coated polycrystalline cubic boron nitride cutting tool according to claim 13 wherein the support containing a notch therein, and the polycrystalline cubic boron nitride cutting insert being within the notch.

15. The coated polycrystalline cubic boron nitride cutting tool according to claim 13 wherein the post-blasted stress condition of the exposed alumina coating layer ranging between about −50 MPa (compressive stress) and about −800 MPa (compressive stress) as measured by XRD using the Psi tilt method and the (024) reflection of alumina, and the exposed alumina coating layer having an initial tensile stress condition ranging between about 50 MPa (tensile stress) and about 800 MPa (tensile stress) as measured by XRD using the Psi tilt method and the (024) reflection of alumina.

16. The coated polycrystalline cubic boron nitride cutting tool according to claim 13 wherein the post-blasted stress condition of the exposed alumina coating layer ranging between about −100 MPa (compressive stress) and about −400 MPa (compressive stress) as measured by XRD using the Psi tilt method and the (024) reflection of alumina, and the exposed alumina coating layer having an initial tensile stress condition ranging between about 100 MPa (tensile stress) and about 450 MPa (tensile stress) as measured by XRD using the Psi tilt method and the (024) reflection of alumina.

17. The coated polycrystalline cubic boron nitride cutting tool according to claim 13 wherein the post-blasted stress condition being achieved by wet blasting off an outer titanium-containing coating layer region initially deposited by chemical vapor deposition on the alumina-containing coating layer region thereby changing the stress condition of the exposed alumina coating layer from an initial stress condition ranging between about 50 MPa (tensile stress) and about 800 MPa (tensile stress) as measured by as measured by XRD using the Psi tilt method and the (024) reflection of alumina.

* * * * *